United States Patent [19]
Huang

[11] Patent Number: 5,604,452
[45] Date of Patent: Feb. 18, 1997

[54] CLOCK GENERATOR USING A STATE MACHINE TO SWITCH BETWEEN TWO OFFSET CLOCKS

[75] Inventor: Yihe Huang, Palo Alto, Calif.

[73] Assignee: Exar Corporation, Fremont, Calif.

[21] Appl. No.: 415,793

[22] Filed: Apr. 3, 1995

[51] Int. Cl.[6] .................................................. H03K 17/00
[52] U.S. Cl. .......................... 327/99; 327/407; 326/46; 326/93
[58] Field of Search .......................... 327/99, 144, 261, 327/263, 291, 292, 294, 298, 407; 326/46, 93, 96; 375/354, 357; 331/1 A, 49, 57; 395/550

[56] References Cited

U.S. PATENT DOCUMENTS

| | | | |
|---|---|---|---|
| 4,229,699 | 10/1980 | Frissell | 327/114 |
| 4,820,992 | 4/1989 | Avis | 327/298 |
| 4,823,262 | 4/1989 | Calle | 364/200 |
| 4,853,653 | 8/1989 | Maher | 331/49 |
| 4,855,615 | 8/1989 | Humpleman | 327/144 |
| 4,870,299 | 9/1989 | Chen | 327/99 |
| 4,965,524 | 10/1990 | Patchen | 327/99 |
| 5,155,380 | 10/1992 | Hwang et al. | 327/99 |
| 5,274,678 | 12/1993 | Ferolito et al. | 375/108 |
| 5,289,050 | 2/1994 | Ogasawara | 327/141 |
| 5,291,528 | 3/1994 | Vermeer | 375/106 |
| 5,315,181 | 5/1994 | Schowe | 326/93 |
| 5,357,146 | 10/1994 | Heimann | 327/292 |
| 5,373,254 | 12/1994 | Nakauchi et al. | 331/1 A |
| 5,389,838 | 2/1995 | Orengo | 326/93 |

*Primary Examiner*—Timothy P. Callahan
*Assistant Examiner*—Kenneth B. Wells
*Attorney, Agent, or Firm*—Townsend and Townsend and Crew LLP

[57] ABSTRACT

A simple structure for switching between two clock signals to produce an output without a glitch or short pulse. The invention is basically a three-input multiplexer controlled by a modified two-bit state machine. The state machine includes flip-flop memories which are driven by the two different clocks, as opposed to using a single clock as in a traditional state machine. The state machine output is used to control the three-input multiplexer, selecting between the first clock, the second clock and an intermediate high level signal during transition. The intermediate high level signal bridges the gap between pulses, eliminating any short glitches.

7 Claims, 3 Drawing Sheets

CLOCK GENERATOR USING A STATE MACHINE TO SWITCH BETWEEN TWO OFFSET CLOCKS

BACKGROUND OF THE INVENTION

The present invention relates to a deglitch switch for switching between two clocks, and more particularly, for generating a clock for a hard disk drive read/write channel.

As general background, when writing to a disk drive, an external clock source, such as quartz crystal is used to generate a clock for timing information. When the data is read back from the disk drive, the clock must be synchronized with the data itself, and thus a phase-locked loop is used to recover the clock from the data which is read back from the disk. In read/write channel, different clocks are used at different portions of the coding/decoding operation, and there is a need to switch from one clock to the other.

When switching between clocks, it is desirable to avoid short pulses, or glitches. A traditional method for eliminating such a glitch is shown in FIG. 1. The two clocks which are being switched, clock A and clock B, are provided to a first multiplexer 12. The output of multiplexer 12 is provided to a dynamic latch 14, which is in turn provided to a second multiplexer 16. A controller circuit 18 controls the operation of the multiplexers and the dynamic latch in response to a select signal on a select line 20. The controller selects between the two clock inputs via a first multiplexer select line 22. The controller receives the output clock of multiplexer 12 on a line 24, and uses it to time the selecting of the dynamic latch on a control line 26 and a selection through a second multiplexer 16 on a line 28. Such a system is used, for example, in chips made by SGS Thompson. The outputs of multiplexer 12 may have a glitch. The glitch is blocked by the dynamic latch. The controller waits until a good clock arrives, then turns on the latch, and the deglitched clock goes through. The second multiplexer 16 is used for power down control. Its function is not deglitch related.

As can be seen, the clock input signals must progress through two multiplexers and a dynamic latch. This long path results in a corresponding long delay. The circuit of FIG. 1 also uses dynamic latches both in the clock path, and in the controller 18. In a power down or other situations, the dynamic latch (which includes capacitive memory) may lose this memory and thus give a wrong clock signal. Accordingly, there is a need to reset it and power up. Finally, the circuit of FIG. 1 has the drawback of being difficult to debug because of wrong states it can go into where it will never self-correct, except on a power on and reset. This design controls the clock selection only at the transistor period of the control signal. In case a wrong clock is selected, (due to, say, noise, or clock hang-up, or the dynamic latch losing memory due to leakage, etc.), the wrong clock signal would stay selected. This situation is like an edge triggered dynamic D-flip-flop. Once the triggering edge is over, the input signal loses control of the output. The circuit then needs a power on reset, or mode switching signal to correct it.

SUMMARY OF THE INVENTION

The present invention provides a simple structure for switching between two clock signals to produce an output without a glitch or short pulse. The invention is basically a three-input multiplexer controlled by a modified two-bit state machine. The state machine includes flip-flop memories which are driven by the two different clocks, as opposed to using a single clock as in a traditional state machine. The state machine output is used to control the three-input multiplexer, selecting between the first clock, the second clock and a high level signal (which is the power supply) during transition. The high level signal bridges the gap between pulses, eliminating any short glitches.

In a preferred embodiment, the three-input multiplexer is implemented with three tri-state inverting switches. The first switch provides the first clock signal, and is controlled by the first bit output of the state machine. The second switch provides the second clock signal, and is controlled by the second bit output of the state machine. The third switch, connecting the high voltage level, is controlled by a NAND function of the inverting outputs of the state machine.

The present invention has the advantage of eliminating the use of dynamic gates, thus eliminating the power down problems. In addition, there are no controller wrong states, and thus no power on reset requirement. The invention is thus more reliable than the prior art.

Although a state machine is used, the actual path between the input clock and the output clock requires the clock signal to go through only one switch and one inverter. The delay is thus short and easy to match where required.

In addition, only a single select signal is required for the switching circuit of the present invention. The multiple control signals of the prior art are not required, thus making the present invention easier to interface with other parts of the read/write control circuit.

For a fuller understanding of the nature and advantages of the invention, reference should be made to the ensuing detailed description taken in conjunction with the accompanying drawings.

DETAILED DESCRIPTION OF THE PREFERRED EMBODIMENTS

Figure 1:
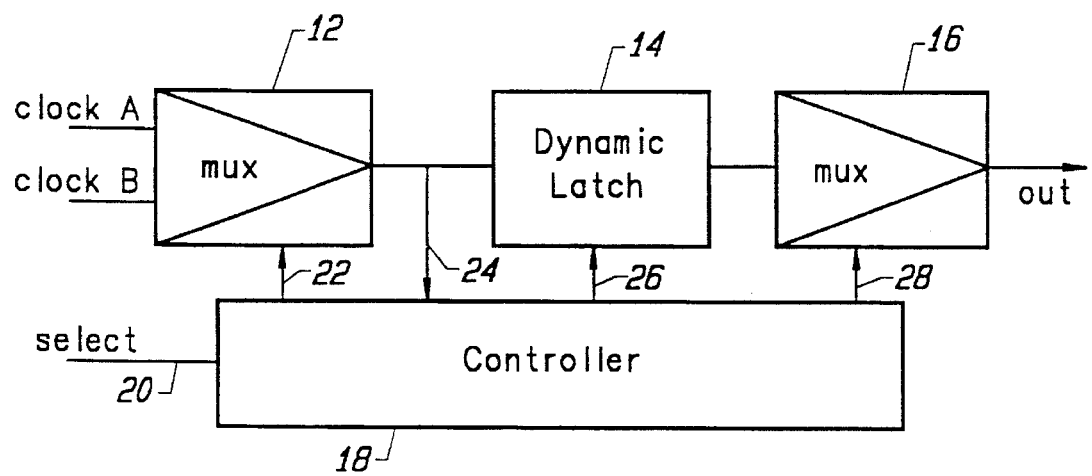
FIG. 1 is a block diagram of a prior art deglitch switching circuit.
Figure 2:
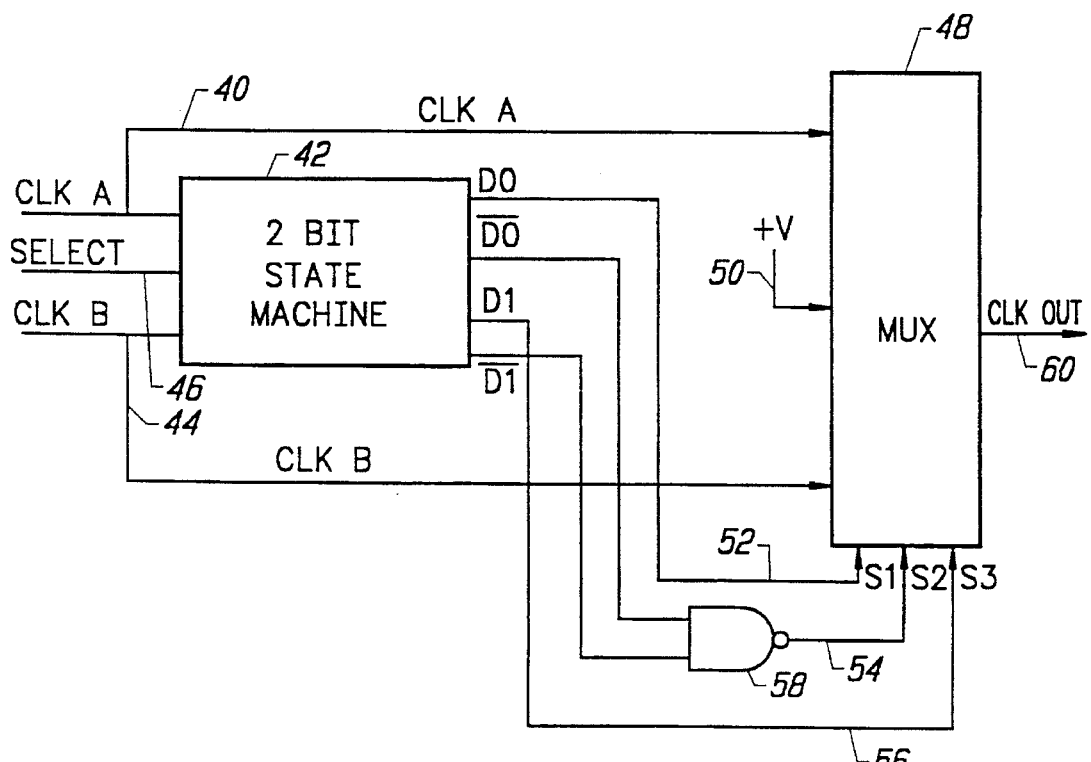
FIG. 2 is a block diagram of the deglitch switching circuit of the present invention.

FIG. 2 is a block diagram of a deglitch switch according to the present invention. A first clock A on a line 40 is provided as a first clock input of a two-bit state machine 42. A second clock B is provided on an input line 44 to the state machine 42. This differs from a traditional state machine, which would have a single clock input. A select input on a line 46 is used to switch between the states of the state machine. The clock A, clock B and select input are the same inputs available for the prior art switch of FIG. 1.

The two clock signals on lines 40 and 44 are provided to a multiplexer 48 which selects between them. A third input of the multiplexer is a positive voltage level on a line 50. The invention operates to select the third input on line 50 as an intermediate level to bridge the gap between pulses that are offset on clock A and clock B, thereby providing a longer pulse, and not a short pulse, during the transition to prevent a glitch. The non-inverting and inverting data output for the two bits of the state machine 42 are provided as select inputs to multiplexer 48 on lines 52, 54 and 56, with the inverting outputs being provided through a NAND gate 58. The operation of the circuit of FIG. 2 is understood better by reference to the more detailed description of FIG. 3, and the accompanying timing diagram of FIG. 4.

Figure 4:
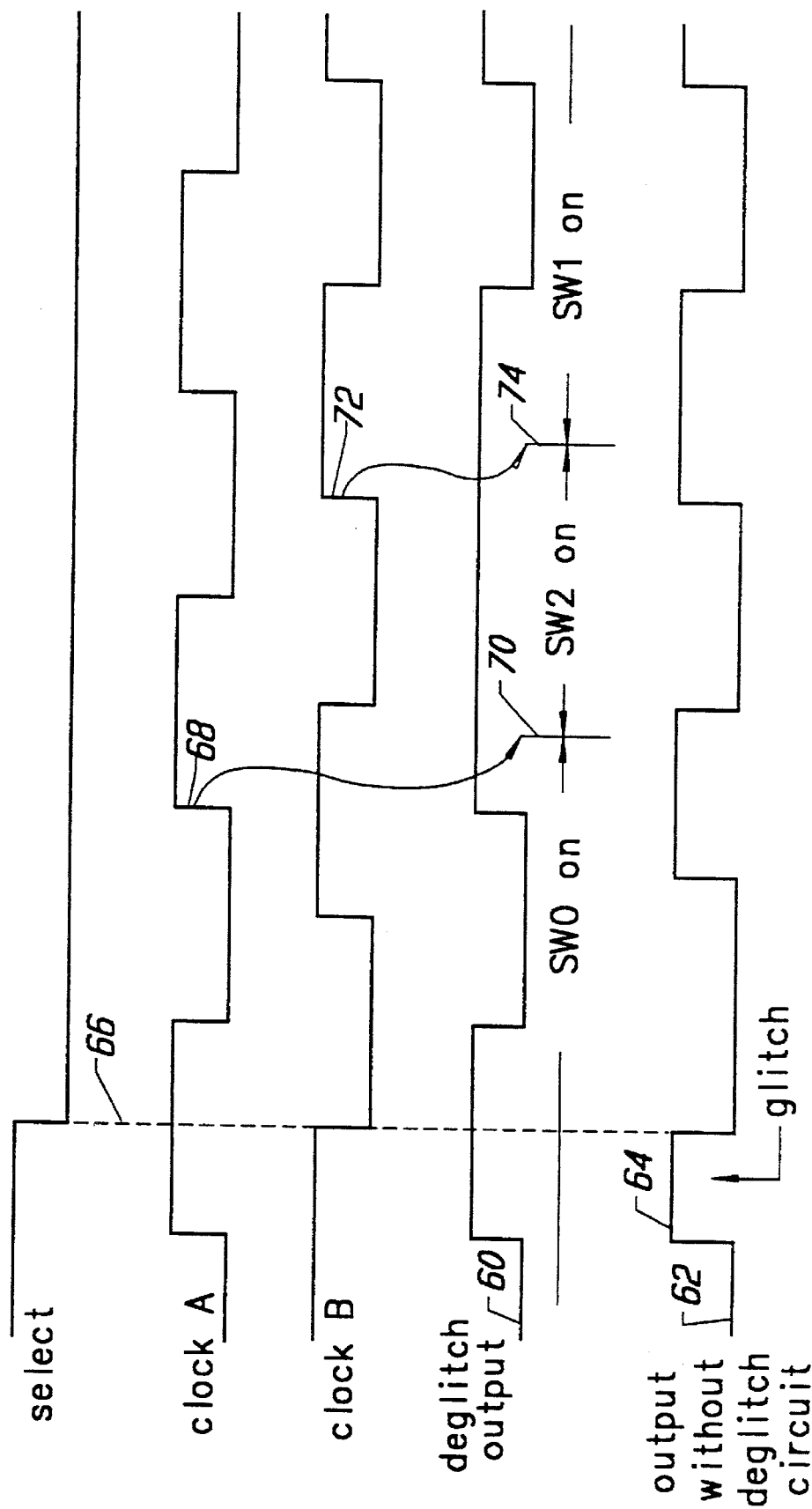
FIG. 4 is a timing diagram illustrating the operation of the circuit of FIG. 3.

Referring first to FIG. 4, FIG. 4 shows the select input transitioning to a low level at the time when clock A is in the middle of a pulse, and clock B is transitioning low. This causes a glitch if these are simply connected through a multiplexer, as shown by signal 62 providing a glitch or short pulse 64.

In the present invention, the deglitched output on line 60 is shown in FIG. 4 as continuing with clock pulse A during this transition of the select input at time 66. This is because the clock A continues to be provided to the output through the multiplexer 48, with the clock A input being provided until after a rising edge 68 of clock A, which causes the intermediate input, the voltage level 50, of multiplexer 48 to be selected and turned on at a time 70. The third input of the multiplexer is selected by the rising edge 72 of clock B, which selects the third input at a time 74, at which point the transition is completed.

Figure 3:
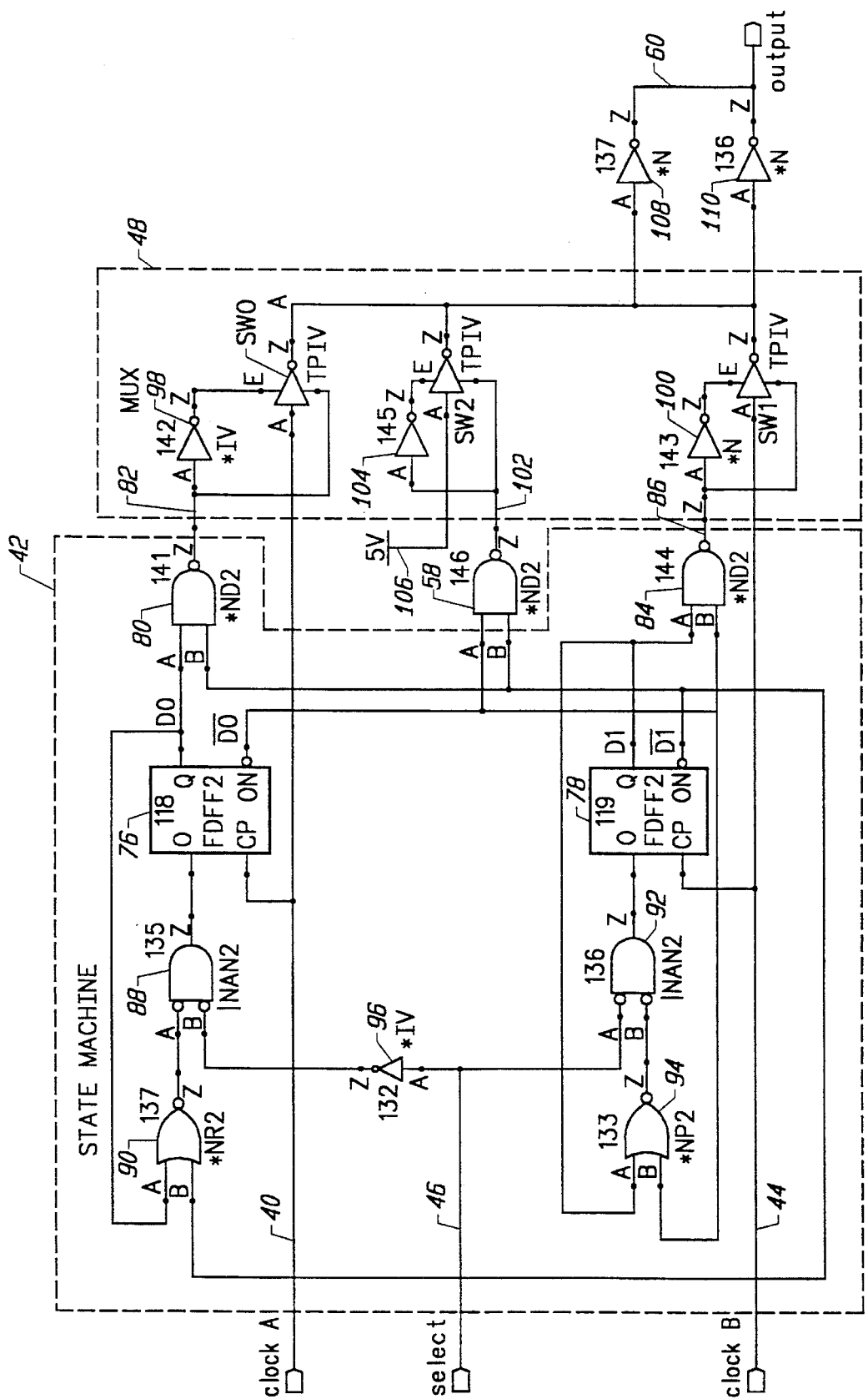
FIG. 3 is a circuit diagram of the circuit of FIG. 2.

Referring to FIG. 3, the state machine is built around a first D flip-flop 76 and a second D flip-flop 78. The first flip-flop is clocked by clock signal A on line 40, and the second flip-flop is clocked by clock B on line 44.

A NAND gate 80 provides the non-inverting output D0 of flip-flop 76 and the inverting output $\overline{D1}$ of flip-flop 78 as an input on line 82 to multiplexer 48. A second NAND gate 84 provides the non-inverting output D1 of flip-flop 78 and the inverting output $\overline{D0}$ of flip-flop 76 to input 86 of multiplexer 48.

The rest of the state machine is composed of an AND gate 88 with an inverting input connected to a NOR gate 90, and an AND gate 92 with an input connected to a NOR gate 94.

NOR gate 90 provides the non-inverting output of flip-flop 76 and the inverting output of flip-flop 78 to one inverting input of AND gate 88. Similarly, NOR gate 94 provides the non-inverting output of flip-flop 78 and the inverting output of flip-flop 76 to one of the inverting inputs of AND gate 92. Select line 46 is provided as the other input to the inverting input of AND gate 92, and through an inverter 96 to the other inverting input of AND gate 88.

Multiplexer 48 is shown in more detail as three tri-state switches indicated as SW0, SW2 and SW1. Input 82 controls a tri-state positive enable input of SW0, and through an inverter 98 controls the negative enable input of the tri-state inverter SW0. Similarly, input 86 controls SW1 through an inverter 100. Finally, NAND gate 58 through its output 102 controls SW2 through an inverter 104.

Referring again to the timing diagram, when select line goes low at a time 66, flip-flop 76 is deselected, but this is not clocked through until the next rising edge of clock A to flip-flop 76, which occurs at a time 68. At this point, a zero value is put through on the D0 output to NAND gate 80, with the inverted value of $\underline{D0}$ put through to NAND gate 58. This causes NAND gate 80 to deselect, on line 82, SW0, and causes NAND gate 58 to select SW2 at point-in-time 70 in FIG. 4. The other input of NAND gate 58 is already at a high level since it is connected to the inverting output of flip-flop 78, which has not yet been selected to cause its value to go to zero.

At a point-in-time 72, clock B has a rising edge which causes the select value at the input of flip-flop 78 to pass through as D1, providing a high level to NAND gate 84, thereby selecting a third switch, SW1. At the same time, SW2 is deselected, since the inverting output of flip-flop 70, $\overline{D1}$, provides a zero input to NAND gate 58, deselecting the NAND gate input to switch SW2. The value of SW2 is simply a high voltage level 106 which is the value provided on the deglitch output between points-in-time 70 and 74, thereby bridging the gap between the pulse of clock A starting at time 68, and the pulse of clock B starting at time 72. In this manner, a long pulse is provided on the deglitch output, as opposed to the short, glitch pulse 64 on an output without the deglitch circuit.

The output is provided through a pair of inverters 108 and 110. These are needed because the original clock signal has been inverted through the switches, and needs to be returned to its original polarity. Two inverters in parallel are provided because their driving capability is necessary for the rest of the circuit.

As would be understood by those familiar with the art, the present invention may be embodied in other specific forms without departing from the spirit or essential characteristics thereof. For example, a different structure could be used for the state machine, and a different structure could be used for the multiplexer, while still carrying out the functions set forth in FIG. 2. Alternately, the intermediate signal could bridge two low pulses, rather than two high pulses. Accordingly, the disclosure of the preferred embodiment of the invention is intended to be illustrative, but not limiting, of the scope of the invention which is set forth in the following claims.

What is claimed is:

1. A clock generator for switching between first and second offset clocks in response to a signal on a select line to provide an output clock at a clock output terminal, comprising:

a two bit state machine having said first and second clocks as clock inputs to generate first and second data outputs, and said select line being connected to a state transition control input of said state machine;

a first tri-state switch having an input coupled to said first clock, a select input coupled to said first data output of said state machine, and an output coupled to said clock output terminal;

a second tri-state switch having an input coupled to a voltage, a select input coupled to an inverse of said first data output of said state machine, and an output coupled to said clock output terminal; and a third tri-state switch having an input coupled to said second clock, a select input coupled to said second data output of said state machine, and an output coupled to said clock output terminal.

2. The clock generator of claim 1 wherein said state machine includes:

a first flip-flop having a clock input coupled to said first clock, a non-inverting output coupled to said select input of said first switch, and an inverting output coupled to said select input of said second switch; and a second flip-flop having a clock input coupled to said second clock and a non-inverting output coupled to said select input of said third switch.

3. The clock generator of claim 2 further comprising:

a NAND-function gate circuit having a first input coupled to an inverting output of said first flip-flop, a second input coupled to an inverting output of said second flip-flop, and an output coupled to said select input of said second switch.

4. A clock generator for switching between first and second offset clocks in response to a signal on a select line to provide an output clock at a clock output terminal, comprising:

a two bit state machine having said first and second clocks as clock inputs to generate first and second data outputs, and said select line being connected to a state transition control input of said state machine;

a first switch having an input coupled to said first clock, a select input coupled to said first data output of said state machine, and an output coupled to said clock output terminal;

a second switch having an input coupled to a voltage, a select input coupled to an inverse of said first data output of said state machine, and an output coupled to said clock output terminal; and a third switch having an input coupled to said second clock, a select input coupled to said second data output of said state machine, and an output coupled to said clock output terminal;

wherein said state machine includes:

a first flip-flop having a clock input coupled to said first clock, a non-inverting output coupled to said select input of said first switch, and an inverting output coupled to said select input of said second switch;

a second flip-flop having a clock input coupled to said second clock and a non-inverting output coupled to said select input of said third switch;

a first NAND gate having a first input coupled to said non-inverting output of said first flip-flop, a second input coupled to an inverting output of said second flip-flop, and an output coupled to said select input of said first switch; and a second NAND gate having a first input coupled to said non-inverting output of said second flip-flop, a second input coupled to said inverting output of said first flip-flop, and an output coupled to said select input of said third switch.

5. The clock generator of claim 4 wherein said state machine further comprises:

a select inverter having an input coupled to said select line;

a first NOR gate having a first input coupled to a non-inverting output of said first flip-flop and a second input coupled to an inverting output of said second flip-flop;

a first AND gate having a first inverting input coupled to an output of said first NOR gate, a second inverting input coupled to an output of said select inverter, and an output coupled to an input of said first flip-flop;

a second NOR gate having a first input coupled to a non-inverting output of said second flip-flop and a second input coupled to an inverting output of said first flip-flop; and a second AND gate having a first inverting input coupled to an output of said second NOR gate, a second inverting input coupled to said select line, and an output coupled to an input of said second flip-flop.

6. The clock generator of claim 1 further comprising an inverter coupled to the outputs of said switches.

7. A clock generator for switching between first and second offset clocks in response to a signal on a select line to provide an output clock at a clock output terminal comprising:

a two bit state machine having said first and second clocks as clock inputs to generate first and second data outputs, and said select line being connected to a state transition control input of said state machine, said state machine including a first flip-flop having a clock input coupled to said first clock, a non-inverting output coupled to said select input of said first switch, and an inverting output coupled to said select input of said second switch, and a second flip-flop having a clock input coupled to said second clock and a non-inverting output coupled to said select input of said third switch;

a first tri-state switch having an input coupled to said first clock, a select input coupled to said first data output of said state machine, and an output coupled to said clock output terminal;

a second tri-state switch having an input coupled to a voltage, a select input coupled to an inverse of said first data output of said state machine, and an output coupled to said clock output terminal;

a third tri-state switch having an input coupled to said second clock, a select input coupled to said second data output of said state machine, and an output coupled to said clock output terminal; and a NAND-function gate circuit having a first input coupled to an inverting output of said first flip-flop, a second input coupled to an inverting output of said second flip-flop, and an output coupled to said select input of said second switch.

* * * * *